(12) United States Patent
Brennan

(10) Patent No.: US 6,903,918 B1
(45) Date of Patent: Jun. 7, 2005

(54) SHIELDED PLANAR CAPACITOR

(75) Inventor: Kenneth D. Brennan, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/828,139

(22) Filed: Apr. 20, 2004

(51) Int. Cl.⁷ ............................................. H01G 4/228
(52) U.S. Cl. .............................. 361/306.1; 361/306.3; 361/321.2; 361/308.1; 361/311; 361/313
(58) Field of Search ........................ 361/306.1, 306.3, 361/308.1, 309, 311, 373, 321.1, 321.2, 321.6, 301.2, 303, 328, 330, 525

(56) References Cited

U.S. PATENT DOCUMENTS

| | | | |
|---|---|---|---|
| 5,220,483 A | | 6/1993 | Scott |
| 5,565,372 A | | 10/1996 | Kim |
| 5,590,016 A | * | 12/1996 | Fujishiro et al. ............ 361/313 |
| 5,822,174 A | * | 10/1998 | Yamate et al. .............. 361/302 |
| 6,066,537 A | | 5/2000 | Poh |
| 6,198,153 B1 | | 3/2001 | Liu et al. |
| 6,600,208 B2 | | 7/2003 | Brennan et al. |
| 6,737,698 B1 | * | 5/2004 | Paul et al. ................... 257/306 |
| 6,753,595 B1 | * | 6/2004 | Lin et al. .................... 257/668 |
| 6,829,135 B2 | * | 12/2004 | Honda et al. ............ 361/306.1 |
| 2004/0032007 A1 | | 2/2004 | Rossi |

* cited by examiner

Primary Examiner—Dean A. Reichard
Assistant Examiner—Nguyen T. Ha
(74) Attorney, Agent, or Firm—Rose Alyssa Keagy; W. James Brady, III; Frederick J. Telecky, Jr.

(57) ABSTRACT

A shielded planar capacitor structure (202) is discussed, formed within a Faraday cage (210) in an integrated circuit device (200). The capacitor structure (202) reduces parasitic capacitances within the integrated circuit device (200). The capacitor (202) comprises a capacitor stack (102) formed between a first and second metal layers (230,232) of the integrated circuit. The capacitor stack (102) has a first conductive layer formed from a third metal layer (106) disposed between the first and second metal layers (230,232) of the integrated circuit, a dielectric isolation layer (110) disposed upon the first conductive layer (106); and a second conductive layer (112) disposed upon the dielectric isolation layer (110) and overlying the first conductive layer (106). The structure (202) further has a first and second isolation layers (104,114) disposed upon opposite sides of the capacitor stack (102). The Faraday cage (210) is formed between the first and second metal layers (230,232) of the integrated circuit (200), comprising a first and second shield layers (402,414) each having a plurality of mutually electrically conductive spaced apart traces (404). The first and second isolation layers (404,414) and the capacitor stack (102,434) are sandwiched between the first and second shield layers (402,414). Conductive elements (432) are distributed around the periphery of the capacitor stack (102,434) and the first and second isolation layers (404,412). The conductive traces (424) of the first shield layer (402) are connected to the conductive traces (424) of the second shield layer (414) through the conductive elements (432).

32 Claims, 5 Drawing Sheets

SHIELDED PLANAR CAPACITOR

FIELD OF INVENTION

The present invention relates generally to semiconductor devices and more particularly to a planar capacitor shielded from noise and parasitic capacitances by a Faraday cage formed within the interconnect layers in the fabrication of integrated circuit devices.

BACKGROUND OF THE INVENTION

In the manufacture of semiconductor products such as integrated circuits, individual electrical devices are formed on or in a semiconductor substrate, and are thereafter interconnected to form circuits. Interconnection of these devices within an integrated circuit is typically accomplished by forming a multi-level interconnect network in layers formed over the electrical devices, by which the device active elements are connected to other devices to create the desired circuits. Individual wiring layers within the multi-level network are formed by depositing an insulating or dielectric layer over the discrete devices or over a previous interconnect layer, and patterning and etching contact openings such as vias. A second pattern and etch defines trenches, the wiring between vias. Conductive material, such as copper is then deposited into the vias and trenches to form the next level of interconnect. Dielectric material is then deposited over the patterned conductive layer, and the process may be repeated any number of times using additional wiring levels laid out over additional dielectric layers with conductive vias therebetween to form the multi-level interconnect network.

As device densities and operational speeds continue to increase and transistor scaling proceeds into the deep submicron regime, reduction of the RC delay times in integrated circuits is desired. These delays may be related to stray parasitic capacitances between adjacent metal lines and/or semiconductor components as well as the resistance of interconnect metal lines through the multi-layer interconnect networks. Some integrated circuits and integrated circuit devices are particularly sensitive to stray capacitances and noise, such as those components at the inputs of operational amplifiers and other similar high input impedance or high gain circuits, high speed switching circuits, or radio frequency (RF) integrated circuits.

A planar capacitor, for example, is a component that is affected in this way by stray capacitive coupling and noise. Accordingly, the structure of some conventional integrated capacitors is such that they tend to receive coupling from various metal lines, semiconductor components and noise sources. Several conventional integrated circuit capacitors have been proposed that are in the proximity of the semiconductor substrate and may have a shield layer between the capacitor and the substrate. At least one conventional approach uses a plate of the capacitor also as the shield, requiring that the shield-plate be grounded or otherwise connected to a "quiet voltage". In these approaches, however, the usefulness of the capacitor may be somewhat limited to those circuit applications where one plate potential can be fixed or predetermined. Another prior art integrated capacitor uses multiple capacitors that are interconnected in a custom arrangement that tends to limit use to specific application configurations.

The measure of the quality factor, or "Q" of a capacitor is another parameter that is particularly important for low-loss capacitors used in RF circuits and various other high-speed circuits. Some existing integrated capacitor designs have a solid conductive plate or shield layer. Such solid conductive layers may tend to develop eddy currents within the plates that needlessly consume power and degrade the Q of the capacitor. In addition, stray capacitances, internal and external circuit noise, EMI, and RFI generally tend to produce unpredictable circuit performance in an unshielded, or inadequately shielded capacitor.

Accordingly, it is desirable to fabricate a planar capacitor integrated within a semiconductor device sufficiently shielded from noise to provide more predictable capacitance performance and circuit design parameters that may be employed to increase speed, reduce cross-talk, and to limit power consumption in modern high-speed, high-density devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to a planar capacitor integrated and shielded. within an enclosed Faraday cage during the fabrication of integrated circuit devices. The shielded capacitor of the present invention effectively mitigates capacitive coupling to adjacent circuit elements or interconnects and avoids a variety of noise sources. The Faraday cage effectively shields the enclosed planar capacitor, and may be fabricated between two or more multi-level interconnect metal layers of a semiconductor device. Preferably, the Faraday cage utilizes unused areas of the metal layers to form first and second shield layers (e.g., conductive metal layers, M3 and M5 metal layers) connected by vias (e.g., copper, tungsten) around the periphery of the capacitor. The capacitor may be formed as a capacitor stack, for example, as two plate layers and a dielectric layer disposed therebetween. The exemplary capacitor stack may be disposed upon a first conductive metal layer (e.g., a copper layer, M4 metal layer) (a bottom electrode) with an overlying dielectric layer (e.g., SiN, hard mask or another etch-stop material layer) and a second conductive layer material such as tantalum (top electrode) overlying the dielectric layer and the first conductive layer.

First and second isolation layers (e.g., low K, TEOS insulative materials) are disposed on either side of the capacitor stack to electrically isolate the capacitor stack between the first and second shield layers of the interconnect metal layers.

In an aspect of the invention the first and second conductive layers of the capacitor comprise a group of mutually electrically conductive spaced apart traces (e.g., traces about 2 micron wide spaced apart by about 0.5 microns).

In another aspect of the invention the first and second shield layers of the Faraday cage have a plurality of mutually electrically conductive spaced apart traces (e.g., traces about 2 micron wide spaced apart by about 0.5 microns).

In yet another aspect of the invention the traces of the first and second shield layers of the Faraday cage are aligned orthogonal to each other.

In still another aspect of the invention the traces of the first and second conductive layers of the capacitor are aligned orthogonal to each other.

In one aspect of the invention the traces of one of the first and second conductive layers of the capacitor are aligned orthogonal to the traces of one of the first and second shield layers of the Faraday cage.

The interconnect vias may be filled with a conductive material to provide a conductive interconnect between the conductive first and second shield layers of the Faraday cage. Optionally, the Faraday cage surrounding the capacitor stack is connected to a ground or another quiet voltage source.

Electrical connections to the plates of the capacitor stack are provided by conductive vias attached to the plates extending through respective openings in the isolation layers and through slots or other such openings in the shield layers. Such slots in the shield layers also mitigate eddy current losses in the capacitor plates or shield layers that would otherwise develop in solid or continuous conductive layers.

The invention provides for more predictable planar capacitor performance that reduces stray capacitance and unwanted coupling by shielding the capacitor stack within a fully enclosed Faraday cage. The invention further allows both plates of the capacitor to float independent of a ground or quiet potential by keeping the functions of the shields separate from those of the capacitor plates. The plurality of conductive traces in the capacitor plates or shield layers of the cage minimize eddy current losses in these conductive layers to provide a low-loss design with a high quality factor and minimal power consumption. In addition, the invention may be employed to simplify planar capacitor fabrication at the metal interconnect layer and via levels, after interconnect routing layout and identifying unused or exclusion zone areas suitable for capacitor placement.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
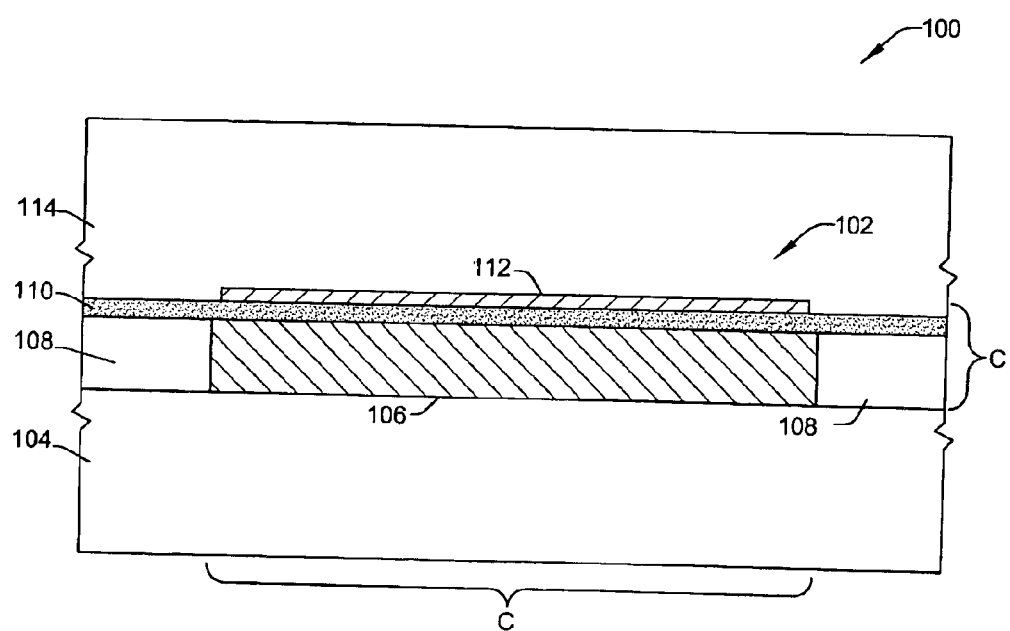
FIG. 1 is a cross-sectional side view illustrating an exemplary planar capacitor stack disposed on a metal layer of a semiconductor device in accordance with an aspect of the present invention.

The present invention will now be described with reference to the attached drawings, wherein like reference numerals are used to refer to like elements throughout. The invention relates to a shielded planar capacitor formed within an enclosed Faraday cage during interconnect metal level processing of integrated circuits and other devices. One or more implementations of the invention are hereinafter illustrated and described in the context of the formation of the planar capacitor and the Faraday cage in semiconductor devices, utilizing etch-stop layers, isolation layers, tantalum, and interconnect metal layers. However, it will be appreciated by those skilled in the art that the invention is not limited to the exemplary implementations illustrated and described hereinafter. In particular, a variety of such materials may be used to form the structures discussed.

As previously indicated, because of increasing device densities and operational speeds, reduction of the delay times in integrated circuits is becoming increasingly desirable. Some of these delays are related to stray parasitic capacitances between adjacent metal lines and various elements within a semiconductor device as well as the resistance of interconnect metal lines through the multi-layer interconnect networks. A planar capacitor, for example, is a component that is affected in this way by stray capacitive coupling and noise.

Although it is a common design practice to place a shield dose to the source of electrical noise, the inventor of the present invention has appreciated that a more effective shield could instead be provided by placing the integrated planar capacitor further from such noise sources in the interconnect metal layers. By contrast, some conventional capacitor structures may be fabricated close to the very semiconductor devices that generate such noise (e.g., switching transistors). The present invention provides a more effective shield by fully enclosing the capacitor within a Faraday cage to provide more predictable capacitor performance parameters. As also indicated, the shielded capacitor structure is preferably located within the metal interconnect layers for easy fabrication of the integrated capacitor.

Further, as a result of the increased device densities, there is also a growing desire to minimize routing complexities within the multi-level interconnect layers. The inventor of the present invention has also realized that by first laying out the interconnect layers that the areas may then be readily adapted for use by the shielded planar capacitor described herein. Preferably, the shield layers of the Faraday cage and the bottom electrode of the capacitor stack would comprise existing metal layers of the multi-level interconnect layers.

Beneficially, no extra process steps or materials are required in the formation of the shielded capacitor structure in one example of the present invention. This is due, in part, because the previous and present process comprises copper diffusion barriers formed between the copper and the dielectric layers as well as between the copper layers and the silicon substrate. Such barriers are typically formed using conductive compounds of transition metals such as tantalum, tantalum nitride, tantalum silicon nitride, PVD tantalum, titanium nitride, and tungsten nitride as well as the various transition metals themselves. Insulators such as silicon nitride and silicon oxynitride have also been used as barrier materials between copper metallurgy and insulative layers. More recently, silicon carbide (SiC) has been used as a copper diffusion barrier material, as well as etch-stop layers and hard masks used during trench and/or via cavity formation.

RC delay times may also be improved by utilizing new porous low dielectric constant (low-k) dielectric materials formed between the wiring metal lines, in order to reduce the capacitance therebetween and consequently to increase circuit speed. Examples of low-k dielectric materials include the spin-on-glasses (SOGs), as well as organic and quasi-organic materials such as polysilsesquioxanes, fluorinated silica glasses (FSGs) and fluorinated polyarylene ethers. Organic, non silicaceous materials such as the fluorinated polyarylene ethers are seeing an increased usage in semiconductor processing technology because of their favorable dielectric characteristics and ease of application. Other low-k insulator materials include organo-silicate-glasses (OSGs), for example, having dielectric constants (k) as low as about 2.6–2.8, and ultra low-k dielectrics having dielectric constants below 2.5. OSG materials, for example, may be low density silicate glasses to which alkyl groups have been added to achieve a low-k dielectric characteristic.

Single and dual damascene processes using OSG, FSG, a low-k dielectric or ultra low-k dielectric materials, SiC and SiC:H materials, and copper metals can thus be employed to increase speed, reduce cross-talk, and reduce power consumption in modem high-speed, high-density devices.

One aspect of the invention provides a shielded planar capacitor that effectively mitigates capacitive coupling to adjacent circuit elements or interconnects and avoids a variety of noise sources. The Faraday cage that shields the enclosed planar capacitor may be fabricated between two or more of the multi-level interconnect metal layers of a semiconductor device. Preferably, the Faraday cage utilizes one or more unused portions of the metal layers to form first and second shield layers (e.g., conductive metal layers, M3 and M5 metal layers). The shield layers, in one example, are connected by vias (e.g., copper, tungsten) around the periphery of the capacitor. The capacitor may be formed as a capacitor stack, for example, having first and second plate layers and a dielectric layer disposed therebetween. The exemplary capacitor stack comprises a first conductive metal layer (e.g., a copper layer, M4 metal layer, the first plate) with an overlying dielectric layer (e.g., SiN, hard mask or another etch-stop material layer) and a second conductive layer (e.g., a tantalum layer, the second plate) overlying the dielectric layer and the first conductive layer.

FIG. 1, for example, illustrates a cross-sectional side view of an exemplary planar capacitor C formed within a semiconductor device 100 in accordance with an aspect of the present invention. Capacitor C of the semiconductor device 100 is formed as a capacitor stack 102 disposed on a first isolation layer 104. The capacitor stack 102 comprises a first conductive layer 106 (e.g., a level "n" metal, M4 metal layer, a copper layer, a first plate) disposed within openings formed in a second isolation layer 108. Capacitor stack 102 further has a dielectric layer 110 (e.g., SiN, a hard mask or another etch-stop material layer, an insulative material layer) overlying the first conductive layer 106 and the surrounding second isolation layer 108. Capacitor stack 102 further includes a second conductive layer 112 (e.g., a tantalum layer, the second plate, a diffusion barrier) overlying the dielectric layer 110 and the first conductive layer 106. Capacitor stack 102 may then be covered with a third isolation layer 114 overlying the second conductive layer 112 of capacitor stack 102 in preparation for another metal interconnect layer.

Figure 2:
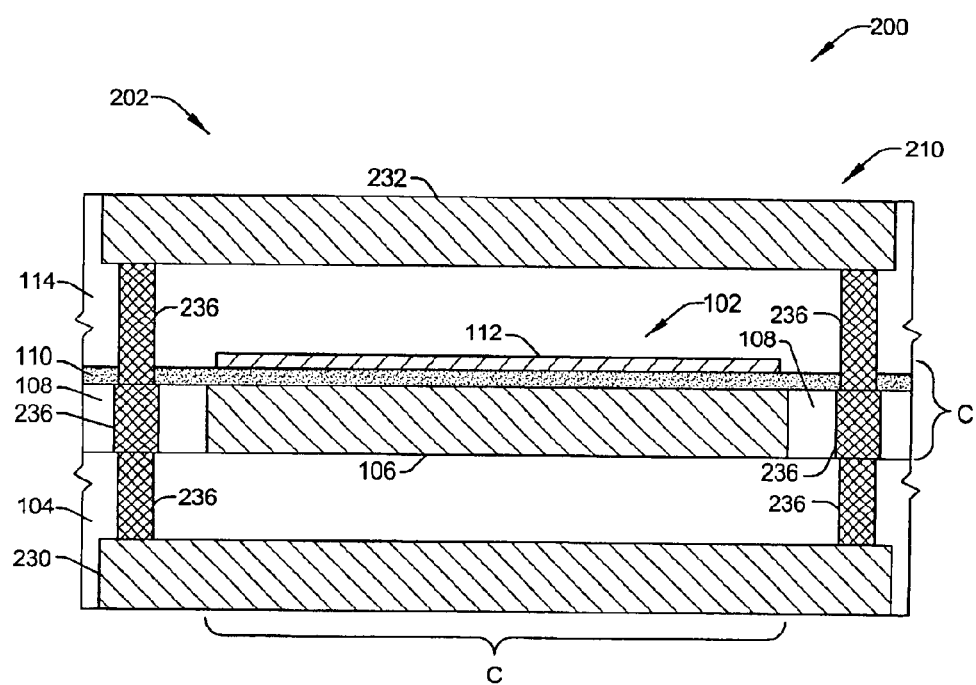
FIG. 2 is a cross-sectional side view section AA taken along dotted line AA of FIG. 3, illustrating an exemplary planar capacitor stack disposed on a metal layer formed between interconnect metal layers and surrounding conductive vias of a Faraday cage in the semiconductor device of FIG. 1.
Figure 3:
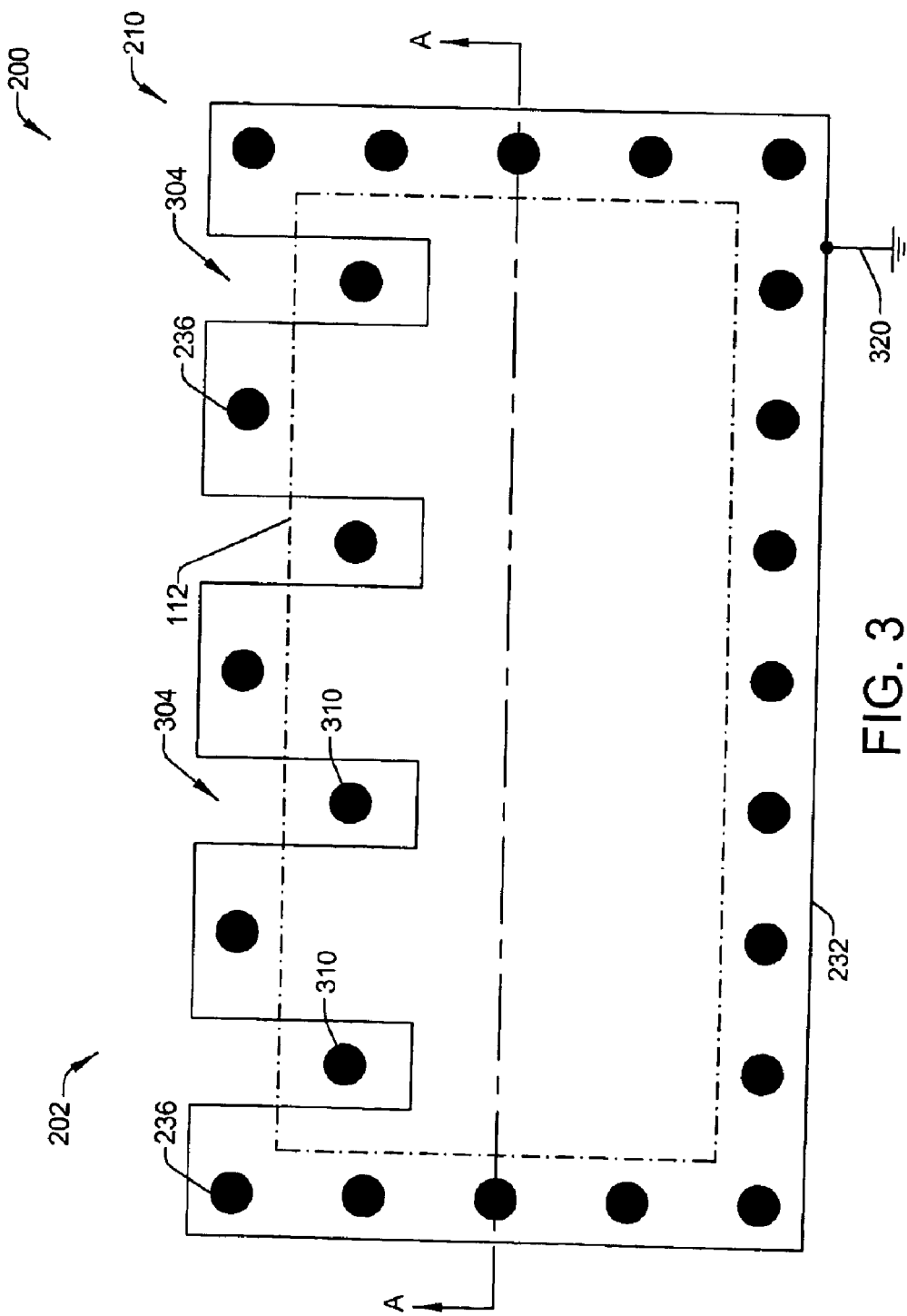
FIG. 3 is a plan view illustrating the exemplary shielded planar capacitor having conductive vias surrounding the periphery of the capacitor plates.

FIGS. 2 and 3 illustrate two views of an exemplary shielded planar capacitor 202 formed within a semiconductor device 200 in accordance with several aspects of the present invention. FIG. 2, for example, illustrates section AA of the planar view of FIG. 3. The shielded planar capacitor 202 of FIG. 2 comprises the capacitor stack 102 of FIG. 1, formed between interconnect metal layers and surrounding conductive vias of a Faraday cage 210 as illustrated in the semiconductor device 200 of FIGS. 2 and 3.

Returning to FIG. 2, the exemplary shielded planar capacitor 202 comprises the capacitor C formed as the capacitor stack 102 of FIG. 1, disposed between first isolation layer 104 and third isolation layer 114, and formed within the Faraday cage 210. Faraday cage 210 comprises a first shield layer 230 (e.g., a level n–1 metal, M3 metal layer, a copper layer) and second shield layer 232 (e.g., a level n+1 metal, M5 metal layer, a copper layer) utilizing one or more unused portion of the interconnect metal layers. Faraday cage 210 further comprises a plurality of conductive vias 236 (e.g., copper, tungsten, or another conductive material) formed within openings in the first, second, and third isolation layers 104, 108, and 114, respectively.

In one example, conductive vias 236 are connected to the first and second shield layers 230 and 232, respectively, around the periphery of capacitor C electrically insulated from capacitor C. Thus, conductive vias 236 electrically couple the shield layers and surround capacitor C, thereby forming an effective Faraday cage to shield the planar capacitor stack 102. Conductive vias 236, may be formed, for example, within openings in the second isolation layer 108 together with first conductive layer 106 (e.g., a level n metal, M4 metal layer, a copper layer, a first plate) or may be formed separately comprising, for example, conductive materials such as copper, tungsten or aluminum.

FIG. 3 further illustrates in plan view the exemplary shielded planar capacitor 202 fabricated in a semiconductor device 200 in accordance with the present invention. Slots 304 in the first shield layer 230 below (not shown) and second shield layer 232 may be used in the Faraday cage 210 of the semiconductor device to provide connective access to conductive vias 310 connected to the capacitor plates, for example, second conductive layer 112. Conductive vias 310 are formed, for example, in openings in the third isolation layer 114 and at the second shield layer 232. In one aspect of the present invention, the Faraday cage 210 may be further coupled to a ground 320 or another quiet voltage point of a circuit wherein the shielded capacitor resides. In another aspect of the present invention, the shape of the shielded planar capacitor may have a generally rectangular shape as shown in the figures herein, or may have any other shape including multiple shapes of smaller planar capacitors connected together to obtain increased capacitance.

Figure 4:
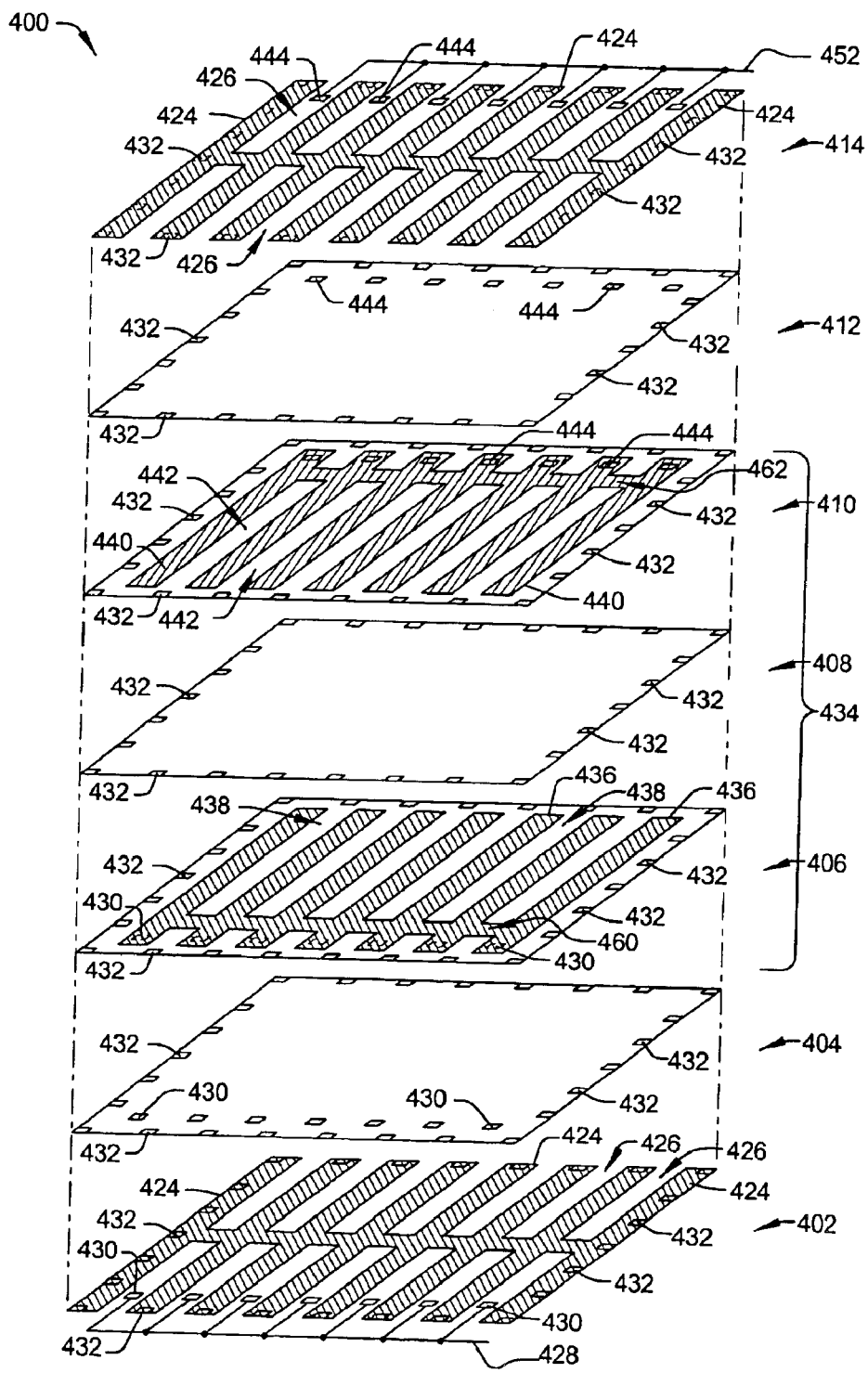
FIG. 4 is an exploded isometric view of an exemplary embodiment of the present invention illustrating a plurality of mutually electrically conductive spaced apart traces of the capacitor plates and the shield layers.
Figure 5:
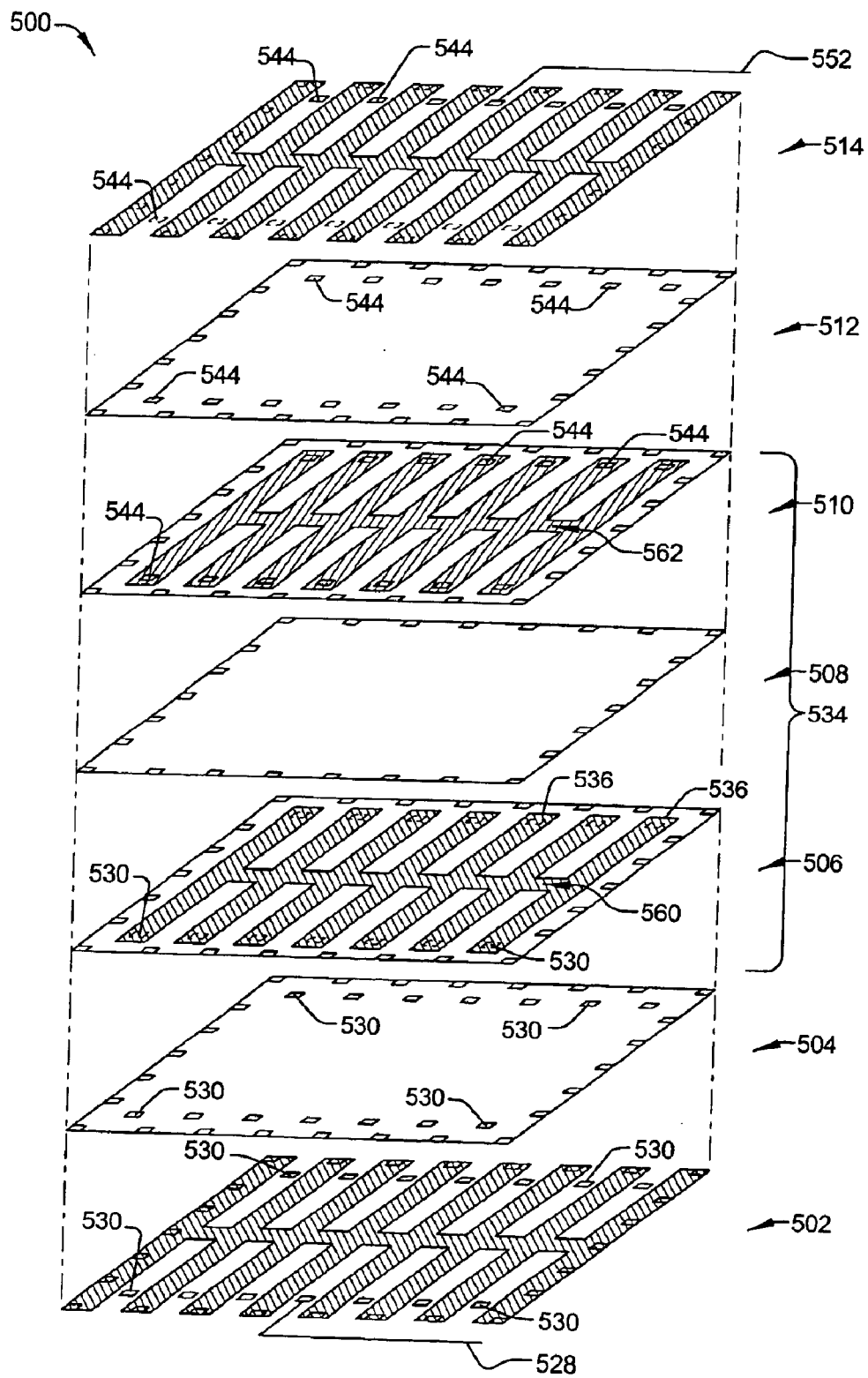
FIG. 5 is an exploded isometric view of another exemplary embodiment of the present invention illustrating a plurality of mutually electrically conductive spaced apart traces of the capacitor plates and the shield layers.

FIGS. 4 and 5 are two exemplary shielded planar capacitors 400 and 500, respectively, illustrating various aspects of the present invention, wherein one or more capacitor plates and shield layers of the shielded planar capacitors comprise a plurality of mutually electrically conductive spaced apart traces. The exemplary shielded planar capacitors 400 and 500 are fabricated with a structure similar to that of FIGS. 2 and 3, illustrating additional details associated with the implementation of such shielded capacitors.

FIG. 4, for example, illustrates an exploded isometric view of exemplary shielded planar capacitor 400 fabricated in accordance with the present invention. Shielded planar capacitor 400 illustrates an example of one or more capacitor plates and shield layers comprising a plurality of mutually electrically conductive spaced apart traces. The inventor of the present invention has appreciated that, even though the surface area of such "slotted" capacitor plates and the corresponding capacitance may actually decrease, the quality factor Q of a shielded planar capacitor may be improved. The inventor realized that the use of solid conductive plates and shield layers often causes eddy currents to develop in the solid relatively large areas thereof and result in added power consumption. This factor may not be as important in the shield layers, but still has other peripheral benefits such as reduction of "dishing" during CMP processing relative to the use of larger continuous or solid conductive areas. In addition, the trace and slot widths involved may, for example, be on the order of around 2 microns, which advantageously provide filtering of relatively high frequency EMI noise.

Shielded planar capacitor 400 comprises a first shield layer 402, a first isolation layer 404, a first conductive layer 406, a dielectric isolation layer 408, a second conductive layer 410, a second isolation layer 412, and a second shield layer 414. The first shield layer 402 is a conductive material comprising, for example, copper from one of the metal interconnect levels such as the M3 level. First shield layer 402 may further be formed as a plurality of conductive traces 424 and spaces or slots 426, wherein the plurality of traces are mutually electrically conductive and spaced apart. The exemplary first shield layer 402 further comprises first plate connections 428 to conductive first plate vias 430 formed in openings in the first isolation layer 404 and electrically connected to the first conductive layer 406 (first capacitor plate).

First isolation layer 404 (e.g., an insulative material, OSG, FSG, TEOS, a low-k dielectric material, or an ultra low-k dielectric material) provides isolation between the first shield layer 402 and the first conductive layer 406 (first capacitor plate). Conductive vias formed in openings in the first isolation layer 404 provide the first plate vias 430 and a plurality of Faraday cage vias 432 connecting the first shield layer 402 to the second shield layer 414 around the outer periphery of the capacitor stack 434 of the shielded planar capacitor 400.

First conductive layer 406 is the first plate of the capacitor stack 434 and is a conductive material comprising, for example, copper from one of the metal interconnect levels such as the M4 level. First conductive layer 406 may further be formed as a plurality of conductive traces 436 and spaces or slots 438, wherein the plurality of traces are mutually electrically conductive and spaced apart. In accordance with one aspect of the present invention, the traces 436 of first conductive layer 406 may, for example, be aligned with traces 424 of first shield layer 402, or may be aligned orthogonal to each other.

Dielectric isolation layer 408 (e.g., SiN, a hard mask or another etch-stop material layer, an insulative material layer) is disposed overlying the first conductive layer 406. Dielectric isolation layer 408 includes the plurality of Faraday cage vias 432 connecting the first shield layer 402 to the second shield layer 414 around the outer periphery of the capacitor stack 434. Dielectric isolation layer 408 is generally designed as a relatively thin layer to maximize the capacitance per unit area.

The second conductive layer 410 (e.g., a tantalum layer, the second plate, a diffusion barrier) is formed overlying the dielectric isolation layer 408. Second conductive layer 410 may further be formed as a plurality of conductive traces 440 and spaces or slots 442, wherein the plurality of traces are mutually electrically conductive and spaced apart. The exemplary second conductive layer 410 further comprises conductive second plate vias 444 formed in openings in the second isolation layer 412 and feeding through to the second shield layer 414.

Second isolation layer 412 (e.g., an insulative material, OSG, FSG, TEOS, a low-k dielectric material, or an ultra low-k dielectric material) provides isolation between the second shield layer 414 and the second conductive layer 410 (second capacitor plate). Conductive vias formed in openings in the second isolation layer 412 provide the second plate vias 444 and a plurality of Faraday cage vias 432 connecting the first shield layer 402 to the second shield layer 414 around the outer periphery of the capacitor stack 434.

The second shield layer 414 is a conductive material comprising, for example, copper from one of the metal interconnect levels such as the M5 level. Second shield layer 414 may further be formed as a plurality of conductive traces 448 and spaces or slots 450, wherein the plurality of traces are mutually electrically conductive and spaced apart. The exemplary second shield layer 414 further comprises second plate connections 452 to the second conductive layer 410 (second capacitor plate) through the conductive second plate vias 444 formed in openings in the second isolation layer 412.

In accordance with one aspect of the present invention, the traces 440 of second conductive layer 410 may, for example, be aligned with traces 448 of the second shield layer 414, or may be aligned orthogonal to each other.

Note, in the particular layout of shielded planar capacitor 400, a web 460 is used across the first plate 406 to electrically connect traces 436, and similarly, a web 462 is used across the second plate 410 to electrically connect traces 440. Although all plate connections (e.g., 428, 452) are shown connected together external to the shielded planar capacitor 400, alternately, as a result of this web connection, only a single plate connection (e.g., 428, 452) need be tied thru a conductive first or second plate via, 430 or 444, respectively. As a further option, the web between the traces of the first or second plate, may be eliminated in an application to balance the eddy current losses and the surge current capabilities of the capacitor.

For example, in one implementation, the web is used with a single external connection through a single conductive first or second plate via to provide a high Q and minimize eddy currents. In another variation and application, multiple external plate connections through multiple conductive plate vias may be used to minimize eddy currents while increasing peak or surge current capabilities.

FIG. 5 illustrates an exploded isometric view of another exemplary shielded planar capacitor 500 fabricated in accordance with the present invention. Shielded planar capacitor 500 illustrates another example of one or more capacitor plates and shield layers comprising a plurality of mutually electrically conductive spaced apart traces. The shielded planar capacitor 500 of FIG. 5 is similar in fabrication to the shielded planar capacitor 400 of FIG. 4, and as such need not be fully described again for the sake brevity.

Shielded planar capacitor 500, similarly comprises a first shield layer 502, a first isolation layer 504, a first conductive layer (first plate) 506, a dielectric isolation layer 508, a second conductive layer (second plate) 510, a second isolation layer 512, and a second shield layer 514. Shielded planar capacitor 500 has as shown, however, a somewhat different layout in regard to the placement of the web connecting across the mid section of first and second plates, 506 and 510, respectively.

In the layout of shielded planar capacitor 500, a web 560 is used across the first plate 506 to electrically connect traces 536, and similarly, a web 562 is used across the second plate 510 to electrically connect traces 540. Again, all plate connections (e.g., 528, 552) may be connected together external to the shielded planar capacitor 500, or, as a result of this web connection, only a single plate connection (e.g., 528, 552) as shown need be tied thru a conductive first or second plate via, 530 or 544, respectively. Thus, the particular placement of this web between the traces, or whether a web is utilized on the first or second plate, may be used to balance the needs between minimal eddy current losses and increased capacitor surge current capabilities.

In accordance with another aspect of the present invention, the traces of either the first or second conductive layer may, for example, be aligned orthogonal to the traces of either the first or second shield layer.

Thus a shielded planar capacitor is formed within an enclosed Faraday cage during interconnect metal level processing of integrated circuits and other devices. In FIGS. 4 and 5, for example, the first shield layer may comprise the M3 metal level, the first conductive layer (first plate) may comprise the M4 metal level, and the second shield layer may comprise the M5 metal level. Further interconnect levels may then be constructed using overlying additional isolation layers and copper filled vias to connect electrical signals to such layers and the shielded planar capacitor as needed to implement a desired circuit.

Accordingly, the planar capacitor integrated as such within a Faraday cage is sufficiently shielded from noise and stray parasitic capacitive coupling from a variety of external sources. Thus, the shielded planar capacitor of the present invention provides more predictable capacitance performance in a circuit, to increase speed, reduce cross-talk, and to limit power consumption in modern high-speed, high-density devices.

These and other aspects of the invention may be carried out in association with shielded planar capacitor formation in any type of interconnect process, including but not limited to single and dual damascene processes. However, it is noted at this point that the invention is not limited to such specific applications, and further that the structures illustrated and described hereinafter are not necessarily drawn to scale.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A capacitor structure formed within a Faraday cage in an integrated circuit, comprising:
    a first isolation layer having an inner surface and an outer surface;
    a second isolation layer having an inner surface and an outer surface;
    a capacitor disposed between the inner surfaces of the first and second isolation layers;
    a first shield layer having a first group of mutually electrically conductive spaced apart traces disposed upon the outer surface of the first isolation layer; and
    a second shield layer having a second group of mutually electrically conductive spaced apart traces disposed upon the outer surface of the second isolation layer, wherein the first group of mutually electrically conductive spaced apart traces are connected to the second group of mutually electrically conductive spaced apart traces through conductive elements distributed along an outer perimeter of the first isolation layer and an outer perimeter of the second isolation layer.

2. The capacitor structure of claim 1, wherein the capacitor disposed between the inner surfaces of the first and second isolation layers comprises:
    a first conductive layer formed from the metal layer of the integrated circuit;
    a dielectric isolation layer disposed upon the first conductive layer; and
    a second conductive layer disposed upon the dielectric isolation layer and overlying the first conductive layer.

3. The capacitor structure of claim 2, wherein at least one of the first and second conductive layers of the capacitor comprises a group of mutually electrically conductive spaced apart traces.

4. The capacitor structure of claim 2, wherein the first conductive layer of the capacitor comprises a first group of mutually electrically conductive spaced apart traces and the second conductive layer of the capacitor comprises a second group of mutually electrically conductive spaced apart traces.

5. The capacitor structure of claim 4, wherein the traces of one of the first and second conductive layers of the capacitor are aligned orthogonal to the traces of one of the first and second shield layers of the Faraday cage.

6. The capacitor structure of claim 2, wherein one of the first and second conductive layers of the capacitor comprise copper.

7. The capacitor structure of claim 2, wherein one of the first and second conductive layers of the capacitor comprise tantalum.

8. The capacitor structure of claim 2, wherein the material of the dielectric isolation layer of the capacitor comprises one of an etch-stop material, SiN, SiC, SiC:H, and a high K material.

9. The capacitor structure of claim 1, wherein one of the first and second shield layers of the Faraday cage comprise copper.

10. The capacitor structure of claim 1, wherein one of the first and second shield layers of the Faraday cage comprise aluminum.

11. The capacitor structure of claim 1, wherein one of the first and second shield layers of the Faraday cage are formed of a material having a low resistivity.

12. The capacitor structure of claim 1, wherein the isolation layers of the Faraday cage are formed of a semiconductor material.

13. The capacitor structure of claim 1, wherein the isolation layers of the Faraday cage comprise one of OSG, FSG, a low-k dielectric material, and an ultra low-k dielectric material.

14. The capacitor structure of claim 1, wherein the isolation layers of the Faraday cage are formed of a TEOS material.

15. The capacitor structure of claim 1, wherein the Faraday cage is formed completely within the metal layers of the integrated circuit.

16. The capacitor structure of claim 1, further comprising vias distributed along each of the outer perimeters of the first and second isolation layers, wherein the vias are filled with the conductive elements.

17. A device for reducing parasitic capacitances within an integrated circuit having a capacitor, comprising:

the capacitor having a capacitor stack formed between a first and second metal layers of the integrated circuit;

a first and second isolation layers disposed upon opposite sides of the capacitor stack;

a Faraday cage formed between the first and second metal layers of the integrated circuit, comprising:

a first and second shield layers each having a plurality of mutually electrically conductive spaced apart traces, wherein the first and second isolation layers and the capacitor stack are sandwiched between the first and second shield layers; and conductive elements distributed along perimeters of the capacitor stack and the first and second isolation layers, wherein the conductive traces of the first shield layer are connected to the conductive traces of the second shield layer through the conductive elements.

18. The capacitor structure of claim 17, wherein the capacitor having a capacitor stack formed between a first and second metal layers of the integrated circuit comprises:

a first conductive layer formed from a third metal layer disposed between the first and second metal layers of the integrated circuit;

a dielectric isolation layer disposed upon the first conductive layer; and a second conductive layer disposed upon the dielectric isolation layer and overlying the first conductive layer.

19. The capacitor structure of claim 18, wherein at least one of the first and second conductive layers of the capacitor comprises a group of mutually electrically conductive spaced apart traces.

20. The capacitor structure of claim 18, wherein the first conductive layer of the capacitor comprises a first group of mutually electrically conductive spaced apart traces and the second conductive layer of the capacitor comprises a second group of mutually electrically conductive spaced apart traces.

21. The capacitor structure of claim 20, wherein the traces of one of the first and second conductive layers of the capacitor are aligned orthogonal to the traces of one of the first and second shield layers of the Faraday cage.

22. The capacitor structure of claim 18, wherein one of the first and second conductive layers of the capacitor comprise copper.

23. The capacitor structure of claim 18, wherein one of the first and second conductive layers of the capacitor comprise tantalum.

24. The capacitor structure of claim 18, wherein the material of the dielectric isolation layer of the capacitor comprises one of an etch-stop material, SiN, SiC, SIC:H, and a high K material.

25. The capacitor structure of claim 17, wherein one of the first and second shield layers of the Faraday cage comprise copper.

26. The capacitor structure of claim 17, wherein one of the first and second shield layers of the Faraday cage comprise aluminum.

27. The capacitor structure of claim 17, wherein one of the first and second shield layers of the Faraday cage are formed of a material having a low resistivity.

28. The capacitor structure of claim 17, wherein the isolation layers of the Faraday cage are formed of a semiconductor material.

29. The capacitor structure of claim 17, wherein the isolation layers of the Faraday cage are formed of a low-K material.

30. The capacitor structure of claim 17, wherein the isolation layers of the Faraday cage are formed of a TEOS material.

31. The capacitor structure of claim 17, wherein the Faraday cage is formed completely within the metal layers of the integrated circuit.

32. The capacitor structure of claim 17, further comprising vias distributed along each of the outer perimeters of the first and second isolation layers, wherein the vias are filled with the conductive elements.

* * * * *